(12) United States Patent  (10) Patent No.: US 6,545,870 B1
Franke et al.  (45) Date of Patent: Apr. 8, 2003

(54) SCREWLESS RETENTION OF HEATSINK LOAD TO CHASSIS

(75) Inventors: Gregory C. Franke, Houston, TX (US); Donald J. Hall, Magnolia, TX (US); Jeffrey A. Lambert, Cypress, TX (US)

(73) Assignee: Hewlett-Packard Development Company, L.P., Houston, TX (US)

( * ) Notice: Subject to any disclaimer, the term of this patent is extended or adjusted under 35 U.S.C. 154(b) by 0 days.

(21) Appl. No.: 10/021,826

(22) Filed: Dec. 14, 2001

(51) Int. Cl.[7] ............................. H05K 7/20; H05K 7/14
(52) U.S. Cl. .................. 361/704; 174/138 E; 257/719; 361/715; 361/719; 361/756; 361/758
(58) Field of Search ........................ 174/138 D, 138 G, 174/138 E; 257/718–719, 726–727; 361/690, 687, 704, 707, 709–710, 715, 719–721, 737, 752, 742, 756, 758, 802–803, 807–810, 816, 818

(56) References Cited

U.S. PATENT DOCUMENTS

| 4,845,590 | A | * | 7/1989 | Mikolajczak | ............... 361/704 |
| 5,801,928 | A | * | 9/1998 | Burstedt et al. | ............ 361/752 |
| 6,259,032 | B1 | * | 7/2001 | Fernandez | .............. 174/138 E |
| 6,313,984 | B1 | * | 11/2001 | Furay | ..................... 174/138 G |
| 6,327,156 | B1 | * | 12/2001 | Wangen | ...................... 361/759 |

* cited by examiner

*Primary Examiner*—Gregory Thompson
(74) *Attorney, Agent, or Firm*—Fletcher, Yoder & Van Someren

(57) ABSTRACT

A technique is provided for the insertion and removal of a motherboard and a heatsink from a computer chassis without the use of tools or threaded fasteners. The technique allows the heatsink to be supported by the chassis and not the motherboard thereby preventing damage to the motherboard.

29 Claims, 5 Drawing Sheets

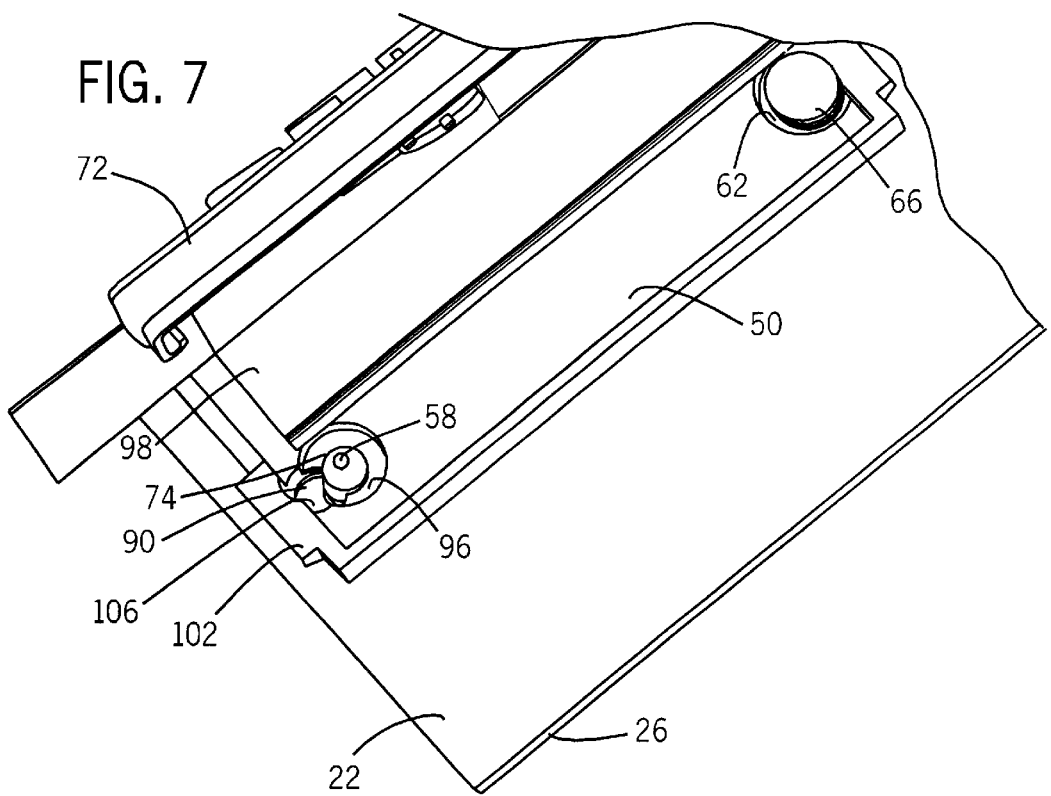
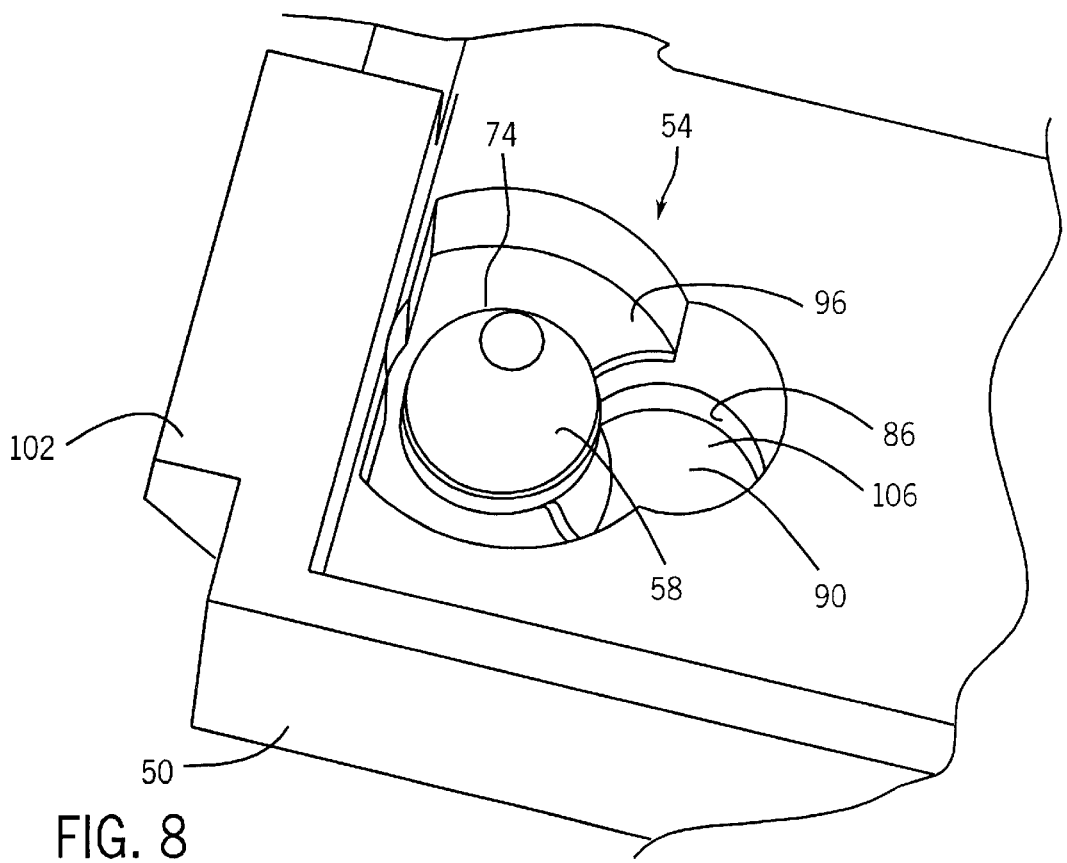

SCREWLESS RETENTION OF HEATSINK LOAD TO CHASSIS

FIELD OF THE INVENTION

The present invention generally relates to the fields of computer design and assembly, and particularly to methods and designs which allow the weight of a heavy component, such as a heatsink, to be directly supported by a chassis.

BACKGROUND OF THE INVENTION

This section is intended to introduce the reader to various aspects of art that may be related to various aspects of the present invention, which are described and/or claimed below. This discussion is believed to be helpful in providing the reader with background information to facilitate a better understanding of the various aspects of the present invention. Accordingly, it should be understood that these statements are to be read in this light, and not as admissions of prior art.

In the field of computer design, processing chips, which perform the computational functions of a computer, typically generate substantial amounts of heat. This heat must be dispersed from around the chip to prevent malfunctions. To accomplish this, heatsinks are typically associated with the chips to provide a structure with high surface area to disperse the heat. As processing chips have grown both faster and hotter, heatsinks have grown proportionately larger and heavier. For example, current heatsinks may weigh more than a half pound to achieve the desired heat dissipating effect.

However, heavier heatsinks, while protecting the processing chip, increase the risk of damage to the motherboard itself due to flexion or other stress related damage. One solution to this problem has been to use the chassis, and not the system board, to support the weight of the heatsink. With such a solution, the heatsink remains associated with the processing chip and motherboard, but the weight of the heatsink is borne by the chassis, not the board. This solution has generally been accomplished by attaching the heatsink, via a retainer, to the chassis using threaded connectors.

The solution, however, is rather complex and requires tools to threadably engage individual fasteners. While methods of inserting and securing a system board without tools or with minimal use of tools have been devised, these advances are mitigated if the heatsink must subsequently be secured to the chassis using tools to perform a complex fastening procedure. Consequently, a methodology or device is desired which allows securing the weight of a heatsink directly to a chassis which does not require tools.

SUMMARY OF THE INVENTION

The following passage is intended only to provide a brief summary of limited aspects of the present inventions and should not be construed as encompassing all necessary elements or steps of the inventions. The present invention is generally related to overcoming the deficiencies inherent in previous designs and methodologies by facilitating insertion and removal of a motherboard with an attached heatsink retainer assembly. The insertion and removal are generally accomplished by providing a chassis comprising integral attachment structures which pass through the motherboard to securely engage a heatsink retainer attached to the motherboard. The engagement of the heatsink retainer and the attachment structures is such that both the heatsink and motherboard are limited in motion but are also both easy to insert and remove with minimal, if any, use of tools.

BRIEF DESCRIPTION OF THE DRAWINGS

The invention will hereafter be described with reference to the accompanying drawings, wherein like reference numerals denote like elements, and:

FIG. 7 is a perspective view of a heatsink retainer mounted to a motherboard;

FIG. 8 is a closeup view of a heatsink retainer engaged to a chassis projection.

DETAILED DESCRIPTION OF EXEMPLARY EMBODIMENTS

It will be appreciated that the present invention can take many forms and embodiments. Some embodiments of the invention are described so as to give an understanding of the invention. It is not intended, however, that the embodiments of the present invention that are described in this specification should limit the invention.

Figure 1:
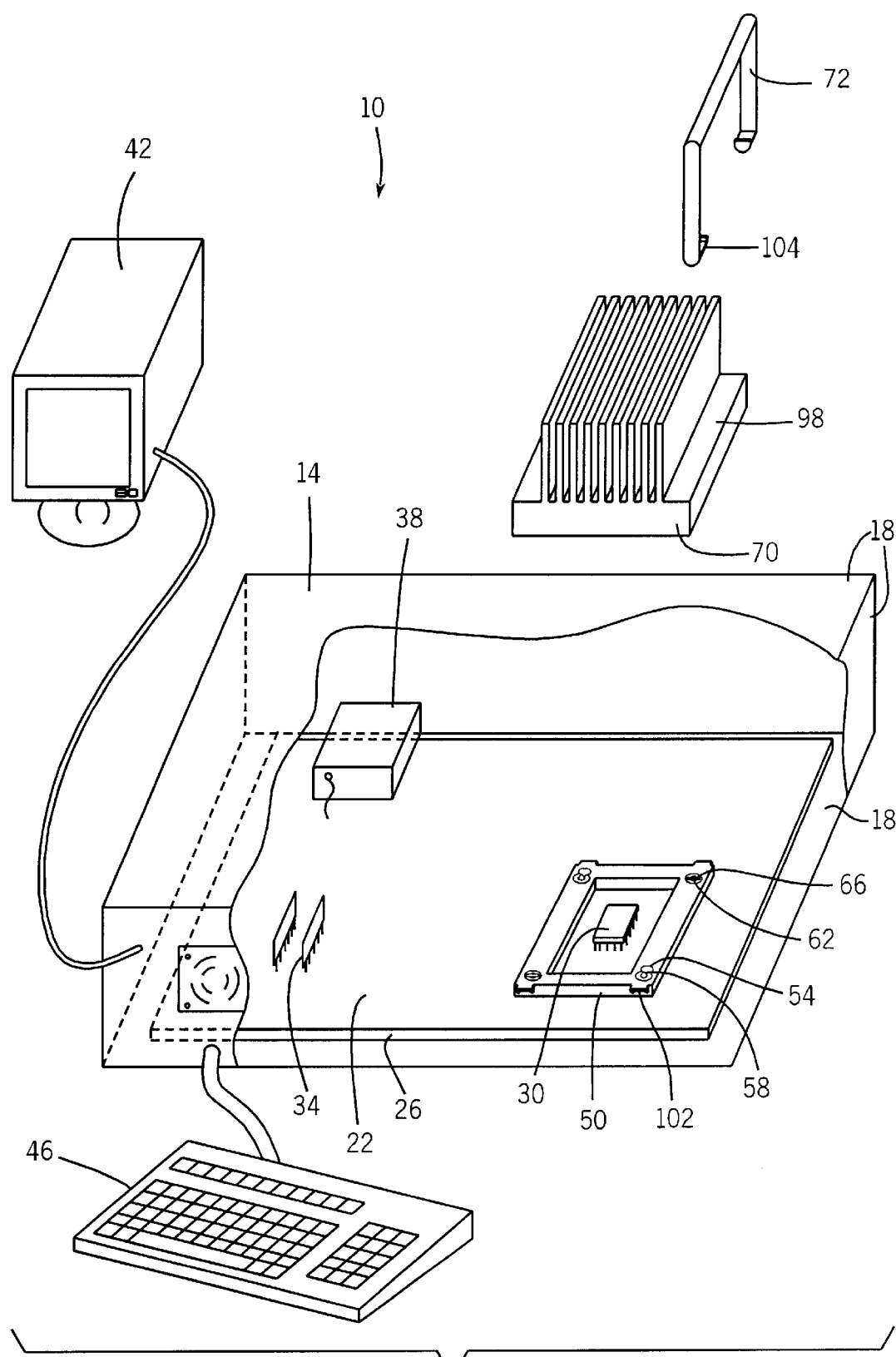
FIG. 1 is a cutaway view of an exemplary computer system.

Turning now to the drawings and referring initially to FIG. 1, there is depicted a cutaway, perspective view of an exemplary computer system 10. Computer system 10 comprises a chassis 14 which in turn is comprised of a number of chassis walls 18. Chassis walls 18 may include the side walls of the chassis, the chassis top, or the chassis floor as illustrated.

In addition, computer system 10 comprises a motherboard 22. Motherboard 22, in turn, comprises a board substrate 26 and components such as central processing unit 30, memory components 34, and heatsink retainer fasteners 66. Disposed about CPU 30 on motherboard 22 is a heatsink retainer 50. Mass storage device 38 also resides within the chassis and is connected to motherboard 22. In addition, the exemplary computer system 10 comprises input and output such as monitor 42 and keyboard 46.

In the illustrated embodiment, heatsink retainer 50 possesses retainer cutouts 54 disposed on opposing corners. Along other opposing corners of heatsink retainer 50 are fastener cutouts 62. Through fastener cutouts 62, heatsink retainer fasteners 66 securely engage heatsink retainer 50 onto motherboard 22.

In computer system 10, heatsink 70 is conformally engaged with retainer 50 such that the bottom of heatsink 70 is in contact with CPU 30. Retainer clips 72 are disposed along heatsink clip facings 98 and securely engage with retainer clip engagements 102 of retainer 50 via hook members 104.

Figure 2:
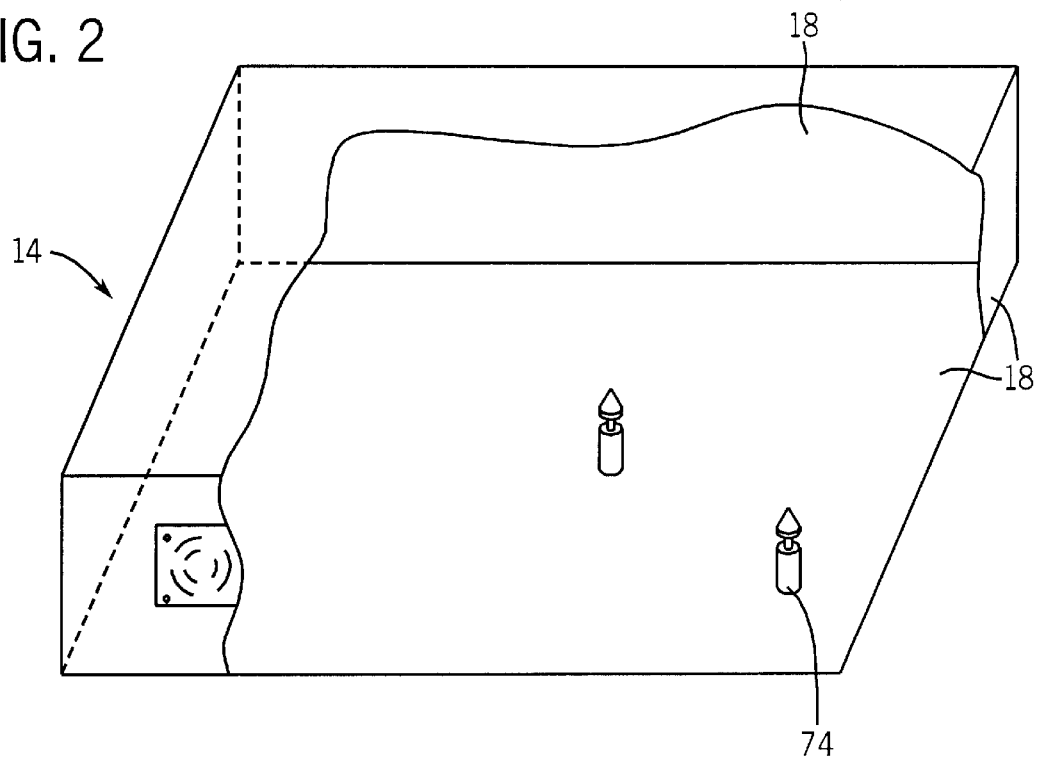
FIG. 2 is a cutaway view of a computer chassis incorporating integral chassis projections.

In this embodiment, heatsink retainer 50 is mountably engaged with chassis 14. Engagement is via chassis projections 74 that may be integrally formed from a chassis wall 18, here the chassis floor, as depicted in FIG. 2. The weight of heatsink 70 is not supported by motherboard 22 but is instead supported directly by the chassis 14 through chassis projections 74. In this manner, motherboard 22 is protected from bending and other stress effects caused by heatsink 70.

Figure 3:
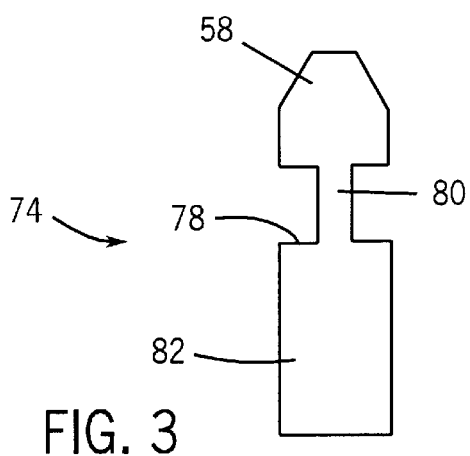
FIG. 3 is a sideview of a chassis projection.

One exemplary chassis projection 74 is depicted in FIG. 3 as a side view. Chassis projection 74 comprises a projection shaft 82, a projection neck 80 as well as a projection head 58. Projection neck 80 forms projection shoulder 78 which serves to engage retainer cutouts 54 and motherboard cutouts 86, thereby supporting heatsink retainer 50 and motherboard 22 respectively.

Figure 4:
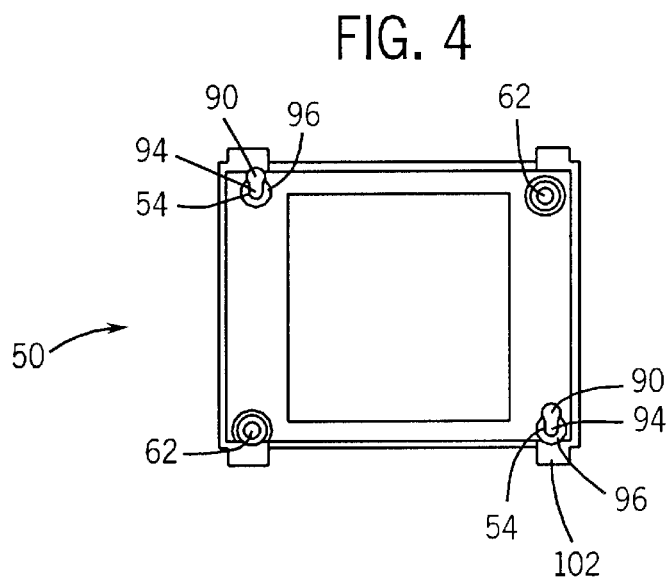
FIG. 4 is a top view of a heatsink retainer.

FIG. 4 depicts a top view of heatsink retainer 50. As depicted in a preferred embodiment, retainer cutouts 54 are disposed upon two of the diametrically opposed corners of retainer 50. Fastener cutouts 62 are disposed upon the remaining corners of retainer 50 and are configured to securely engage heatsink retainer fasteners 66 projecting from motherboard 22. In addition, a retainer clip engagement 102 is evident generally disposed upon each corner of heatsink retainer 50. In the preferred embodiment, engagement 102 is configured to engage with hook member 104 located upon retainer clip 72. In an alternative embodiment, engagement 102 may simply form a projection configured to engage a windowed cutout on retainer clip 72.

As depicted, retainer cutouts 54 are generally keyhole shaped, comprising a generally rounded cutout pass-through 90 and a narrower sliding lockout 94. The region adjacent to sliding lockout 90 not comprising cutout pass-through 90 comprises a narrow, shelf-like, partial circle forming retainer shoulder engagement 96.

Cutout pass through 90 is configured to allow passage of projection head 58 of chassis projection 74. Chassis projection 74 may then be slidably engaged with sliding lockout 94 which is configured to allow passage of projection neck 80 but not projection head 58. Thus, when chassis projection 74 is slidably engaged with sliding lockout 94, projection head 58 is prevented from passing through sliding lockout 94.

As depicted in the exemplary embodiment, retainer cutouts 54 are configure asymmetrically on heatsink retainer 50. One retainer cutout 54 is configured such that cutout passthrough 90 is adjacent to the edge of retainer 50. The other retainer cutout 54 is configured such that sliding lockout 94 is adjacent to the edge of retainer 50. This asymmetry is necessary for an installer to be able to slide heatsink retainer 50 in a single direction in order to engage chassis projections 74.

Figure 5:
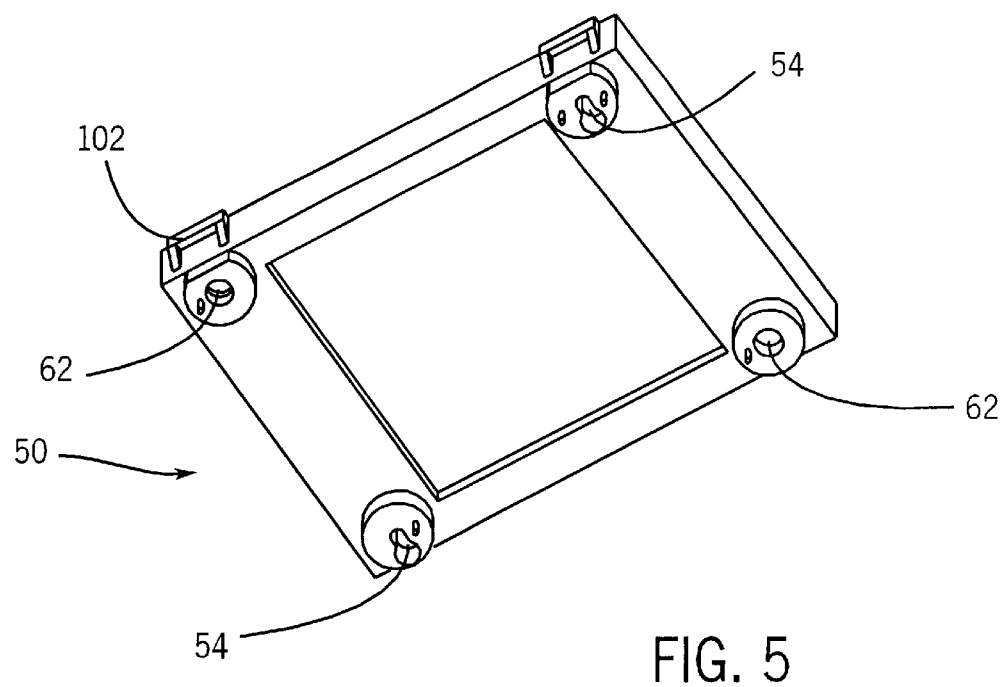
FIG. 5 is a perspective view of a heatsink retainer.

FIG. 5 depicts the heatsink retainer 50 from a perspective. The keyhole configuration of retainer cutouts 54, the asymmetry of retainer cutouts 54, and the engagement surfaces of retainer clip engagements 102 are clearly depicted.

Figure 6:
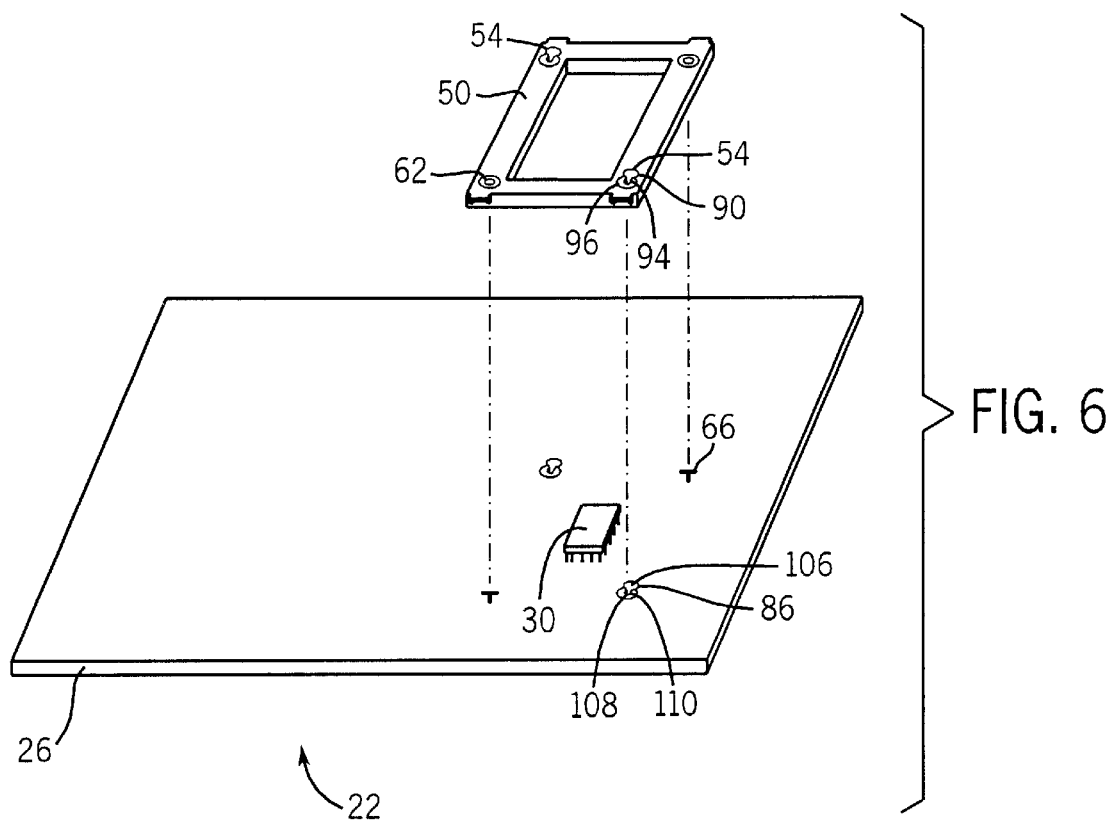
FIG. 6 is an exploded view of a motherboard and heatsink retainer.

FIG. 6 shows a simplified perspective view of the association between heatsink retainer 50 and motherboard 22. Motherboard 22 comprises two fasteners 66 as well as CPU 30. Fasteners 66 are diametrically opposed relative to CPU 30 and are configured to pass through fastener cutouts 62 on heatsink retainer 50. When fasteners 66 pass through fastener cutouts 62, heatsink retainer 50 is securely engaged to motherboard 22.

In the illustrated embodiment, motherboard 22 further comprises two motherboard cutouts 86 diametrically opposed to one another relative to the CPU 30 and disposed so as to each be in alignment with a retainer cutout 54. Likewise, motherboard cutouts 86 are generally keyhole shaped in conformance with their respective retainer cutout 54. Motherboard cutouts 86 therefore comprise a generally round motherboard pass-through 106 and a narrower motherboard lockout 108. Likewise the region around motherboard lockout 108 not comprising motherboard pass-through 106 comprises a motherboard engagement region 110 configured to come into engagement with projection shoulder 78 upon slidable engagement, thus preventing passage of either projection head 58 or projection shaft 82. Once heatsink retainer 50 is affixed to motherboard 22 via fasteners 66 and fastener cutouts 62, retainer cutouts 54 are aligned with respective motherboard cutouts 86.

Next, as FIG. 7 depicts from a birdseye perspective, Motherboard 22 and heatsink retainer 50 are slidably engaged with chassis projections 74. Engagement is accomplished by passing chassis projections 74 through both motherboard pass-through 106 and cutout pass-through 90. Heatsink retainer 50 and motherboard 22 may then be slidably engaged with chassis projection 74 so that projection neck 80 slides into sliding lockout 94 and motherboard lockout 108. After sliding engagement, projection shoulder 78 is supports the lower surface of motherboard engagement 110. Projection shoulder 78 is thereby supporting retainer shoulder engagement 96 via motherboard engagement 110. In this manner, the weight of heatsink 70 is distributed directly to chassis 14 via chassis projections 74.

Figure 9:
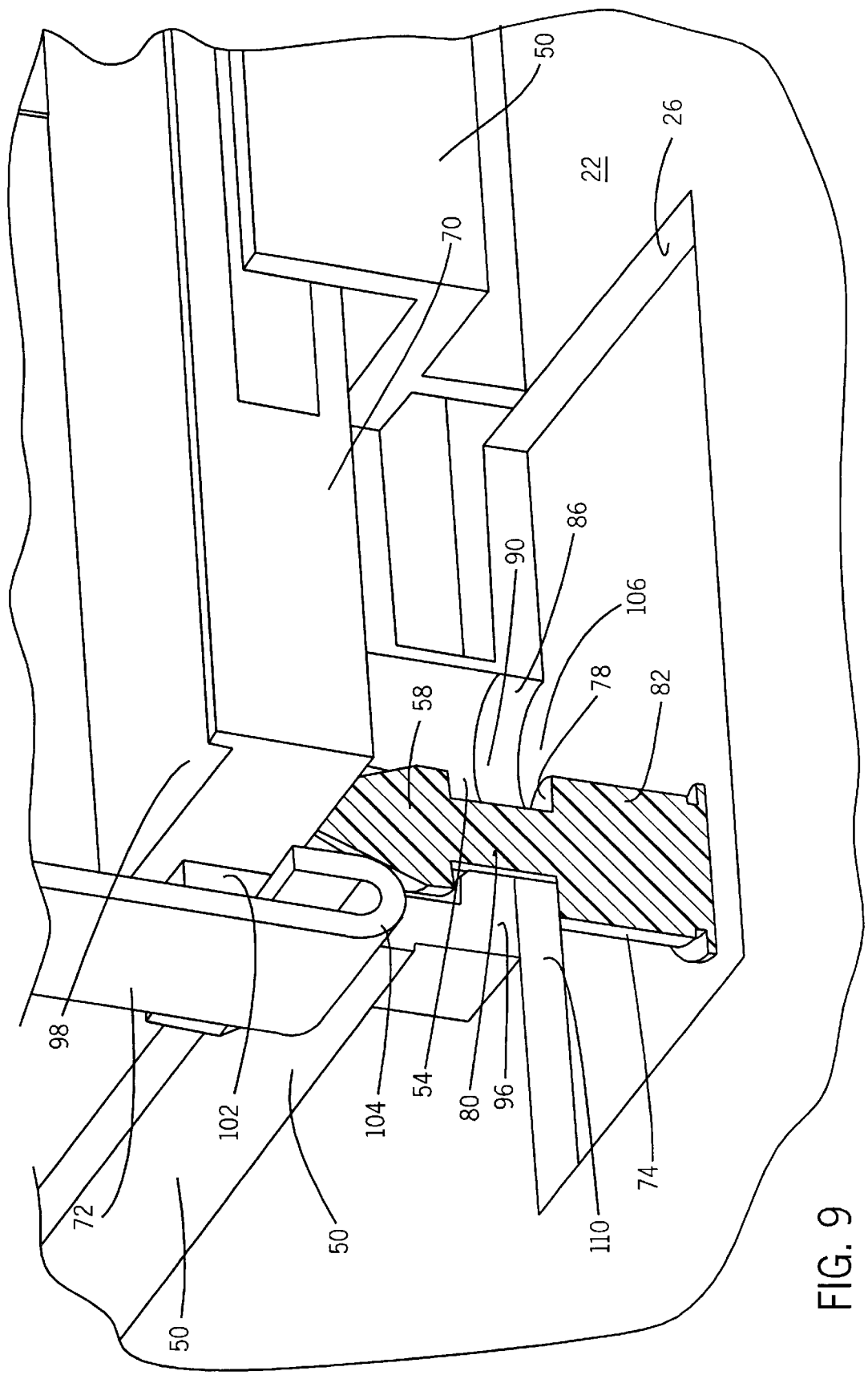
FIG. 9 is a perspective view of a heatsink retainer engaged to a chassis projection where the motherboard, heatsink retainer and chassis projection are shown in cross-section.

FIG. 8 depicts a close-up, birdseye perspective of the engagement of chassis projection 74 with heatsink retainer 50 and motherboard 22. FIG. 9 depict a cut-away perspective view of the engagement. In FIG. 9, the engagement of motherboard engagement 110 and retainer shoulder engagement 96 with projection neck 80 and projection shoulder 78 is clearly seen. FIG. 9 also clearly demonstrates the method by which motherboard 22 and heatsink retainer 50 are disengaged from chassis projection 74. By sliding motherboard 22 and heatsink retainer 50 so that chassis projection 74 is in motherboard pass-through 106 and cutout passthrough 90, motherboard 22 and heatsink retainer 50 may then be lifted off of chassis projections 74.

Due to chassis projections 74, it is possible for motherboard 22 and heatsink retainer 50 to be inserted and supported within chassis 14 without the use of tools. The combination of pass-throughs and engagement surfaces in both motherboard 22 and heatsink retainer 50 make such insertion and support possible. By using chassis projections 74 and the sliding lockouts 94 of retainer 50, it is possible for heatsink retainer 50 to be directly engaged with the chassis 14 in a tool-free manner.

While the invention is susceptible to various modifications and alternative forms, specific embodiments have been shown by way of example in the drawings and have been described in detail herein. However, it should be understood that the invention is not intended to be limited to the particular forms disclosed. Rather, the invention is to cover all modifications, equivalents and alternatives falling within the spirit and scope of the invention as defined by the appended claims.

What is claimed is:

1. A method for securing a heatsink retainer to a chassis comprising:

placing a motherboard bearing an attached heatsink retainer into a chassis;

inserting two or more chassis projections through corresponding motherboard cutouts and corresponding heatsink retainer cutouts; and positioning the motherboard and the attached heatsink retainer such that a motherboard lockout portion of each motherboard cutout and a retainer lockout portion of each retainer cutout is securely held against a shoulder on each chassis projection.

2. The method of claim 1, comprising the further step of securing a heatsink to the heatsink retainer.

3. A method for securing a heatsink load to a chassis comprising:
   inserting two or more chassis projections through two or more corresponding cutouts on a heatsink retainer; and
   sliding the heatsink retainer so that a shoulder engagement region adjacent to each cutout slidably engages a complementary shoulder of each chassis projection.

4. The method of claim 3, comprising the further act of securing a heatsink to the heatsink retainer.

5. The method of claim 3, comprising the further act of attaching the heatsink retainer to a motherboard prior to engagement with the chassis projections.

6. The method of claim 3, comprising the further act of attaching the heatsink retainer to a motherboard similarly engaged with the chassis projections.

7. A motherboard designed for insertion into a chassis without tools comprising:
   a board component;
   a processing unit disposed upon the board component;
   two or more retainer fasteners disposed about the processing unit;
   two or more board cutouts disposed about the processing unit and passing through the board component wherein each board cutout comprises a board pass-through and board lockout adapted to engage a corresponding chassis projection;
   a heatsink retainer disposed about the processing unit comprising:
      two or more retainer cutouts wherein each retainer cutout is aligned with a corresponding board cutout and each retainer cutout comprises a retainer pass-through and a retainer lockout adapted to engage the corresponding chassis projection; and
      two or more fastener cutouts wherein each fastener cutout is aligned with a corresponding retainer fastener such that the fastener passes through the fastener cutout to affix the heatsink retainer to the board component.

8. The motherboard of claim 7, further comprising a heatsink attached to the heatsink retainer.

9. The motherboard of claim 7, wherein the two or more board cutouts are spaced apart.

10. The motherboard of claim 9, wherein at least two of the two or more board cutouts are placed in opposition relative to the CPU.

11. The motherboard of claim 7, wherein the two or more retainer cutouts are spaced apart.

12. The motherboard of claim 11, wherein at least two of the two or more retainer cutouts are placed in opposition upon the heatsink retainer.

13. The motherboard of claim 7, wherein the corresponding chassis projections comprise a shoulder such that the board lockout rests upon the shoulder when the chassis projections are engaged by the board lockout.

14. The motherboard of claim 7, wherein the board cutouts are substantially keyhole shaped.

15. The motherboard of claim 14, wherein the board lockout comprises the narrow portion of the keyhole shaped board cutouts and the board pass-through comprises the wide rounded portion of the keyhole shaped board cutout.

16. The motherboard of claim 7, wherein the retainer cutouts are generally keyhole shaped.

17. The motherboard of claim 16, wherein the retainer lockout comprises the narrow portion of the keyhole shaped retainer cutouts and the retainer pass-through comprises the wide rounded portion of the keyhole shaped retainer cutout.

18. A computer system comprising:
   a chassis comprising a chassis wall, the chassis wall comprising two or more chassis projections;
   a motherboard comprising:
      two or more board cutouts wherein each board cutout comprises a board lockout portion configured to engage a corresponding chassis projection;
      a heatsink retainer having:
         two or more retainer cutouts wherein each retainer cutout is aligned with a corresponding board cutout and each retainer cutout comprises a retainer lockout portion configured to engage the corresponding chassis projection; and
      a heatsink affixed to the heatsink retainer.

19. The computer system of claim 18, wherein the chassis wall is a chassis floor.

20. The computer system of claim 18, wherein the two or more chassis projections are spaced apart.

21. The computer system of claim 18, wherein the two or more board cutouts are spaced apart.

22. The computer system of claim 21, wherein at least two of the two or more board cutouts are placed in opposition relative to a CPU.

23. The computer system of claim 18, wherein the two or more retainer cutouts are spaced apart.

24. The computer system of claim 23, wherein at least two of the two or more retainer cutouts are placed in opposition upon the heatsink retainer.

25. The computer system of claim 18, wherein the chassis projections comprise a shoulder such that the board lockout portion rests upon the shoulder when the chassis projections are engaged by the board lockout portion.

26. The computer system of claim 18, wherein the board cutouts are generally keyhole shaped.

27. The computer system of claim 26, wherein the board lockout portion comprises the narrow portion of the keyhole shaped board cutouts.

28. The computer system of claim 18, wherein the retainer cutouts are generally keyhole shaped.

29. The computer system of claim 28, wherein the retainer lockout portion comprises the narrow portion of the keyhole shaped retainer cutouts.

* * * * *